United States Patent [19]

Clark et al.

[11] 4,071,364

[45] Jan. 31, 1978

[54] PROCESS OF PHOTOETCHING A METAL COMB

[76] Inventors: William Frederick Clark, 67 Arkley Road, Walthamstow, London E. 17; Philip Noel Baxendale, 19 Melville Road, Edgbaston, Birmingham B16 9LN; Michael Noel Peters, 60 Cromwell Road, Southend-on-Sea, Essex, SS2 5NQ all of England

[21] Appl. No.: 627,034

[22] Filed: Oct. 30, 1975

Related U.S. Application Data

[63] Continuation of Ser. No. 499,071, Aug. 20, 1974, abandoned.

[30] Foreign Application Priority Data

Sept. 22, 1973 United Kingdom ............... 39873/73

[51] Int. Cl.$^2$ ................................................ G03C 5/00
[52] U.S. Cl. ........................................... 96/36; 84/96; 156/656; 156/659
[58] Field of Search .................... 96/36, 27 R, 36.1; 84/94, 95, 96; 156/656, 659

[56] References Cited

U.S. PATENT DOCUMENTS

| 474,370 | 5/1892 | Corthell | 84/96 |
| 519,816 | 5/1894 | Langfelder | 84/95 |
| 2,346,444 | 4/1944 | Machlin et al. | 84/95 |
| 2,876,670 | 3/1959 | Duncan | 84/94 |
| 3,156,563 | 11/1964 | Harrison et al. | 96/36 |
| 3,159,486 | 12/1964 | Henderson | 96/36 |
| 3,620,736 | 11/1971 | Tarkington | 96/36 |
| 3,674,488 | 7/1972 | Dodd et al. | 96/36.1 X |

*Primary Examiner*—Edward C. Kimlin
*Attorney, Agent, or Firm*—Haseltine, Lake & Waters

[57] ABSTRACT

A musical movement which comprises, primarily, a metal comb produced by a chemical machining process and, secondarily, a drum in the shape of a frustum of a stepped comb. The comb is advantageously provided with means whereby it can be fastened to a movement base without employing bolts or the like and the drum steps advantageously have projections, for co-operation with the comb teeth, that do not extend further radially than do the immediately neighboring drum steps of larger size.

5 Claims, 1 Drawing Figure

PROCESS OF PHOTOETCHING A METAL COMB

CROSS RELATED APPLICATION

This application is a continuation of Ser. No. 499,071 filed Aug. 20, 1974 and now abandoned.

FIELD OF THE INVENTION

This invention relates to musical movements.

BACKGROUND

In conventional musical movements, the sound is produced by a "comb" that is punched out of sheet metal, the lengths and the number of the teeth or prongs of the comb varying in order to provide a scale range of notes. Such combs are usually ground to shape after having been punched from a suitable sheet metal such as, for example, spring steel and, subseuently, each prong or tooth of the comb is individually tuned by a further grinding operation. It will be appreciated that this method of manufacture of combs for use in musical movements is costly and time-consuming and has the disadvantage that the grinding operations which are performed upon the combs and their individual prongs or teeth inevitably introduce stresses into the metal which stresses affect the tone of the sounds which the comb can produce, usually in an adverse manner.

SUMMARY OF THE INVENTION

An object of the invention is the provision of metal combs for use in musical movements that can be prodduced in a simple and inexpensive manner that does not require the combs to be subject to specialized tuning operations.

According to the invention, there is provided a metal comb for use in a musical movement, the comb being produced by a chemical machining process.

Conventional musical movements usually include a drum of basically right-circular cylindrical configuration having pins protruding from its surface, the drum being rotated to cause the prongs or teeth of the comb to be vibrated and the ends of said prongs or teeth being aligned near the surface of the drum for that purpose. Such drums are usually produced by punching protrusions from a sheet to form the pins and by subsequently bending the punched sheet into a cylindrical configuration or, alternatively, by setting separate pins individually into drilled holes formed in a metallic cylinder. It has also been proposed to form such cylindrical drums by the moulding of a synthetic plastic material but this requires a complicated assembly of movable cores and is a costly operation which does not usually produce a very satisfactory moulding. It is an object of a subsidiary feature of the present invention to provide a drum for a musical movement which can be produced by diecasting or moulding in a manner which is simple and inexpensive but which nevertheless results in an entirely satisfactory result.

BRIEF DECRIPTION OF THE DRAWING

For a better understanding of the invention, and to show how the same may be carried into effect, reference will now be made, by way of example, to the accompanying drawings, in which:

FIG. 1 is a perspective view of a musical movement in accordance with the invention in a disassembled or exploded condition, FIG. 2 is a part-sectional plan view illustrating two of the parts that are illustrated in FIG. 1 with one of those parts exhibiting an alternative fastening arrangement, and FIG. 3 is a perspective view illustrating a further alternative fastening arrangement to those illustrated in FIGS. 1 and 2.

DETAILED DESCRIPTION

Figure 1:
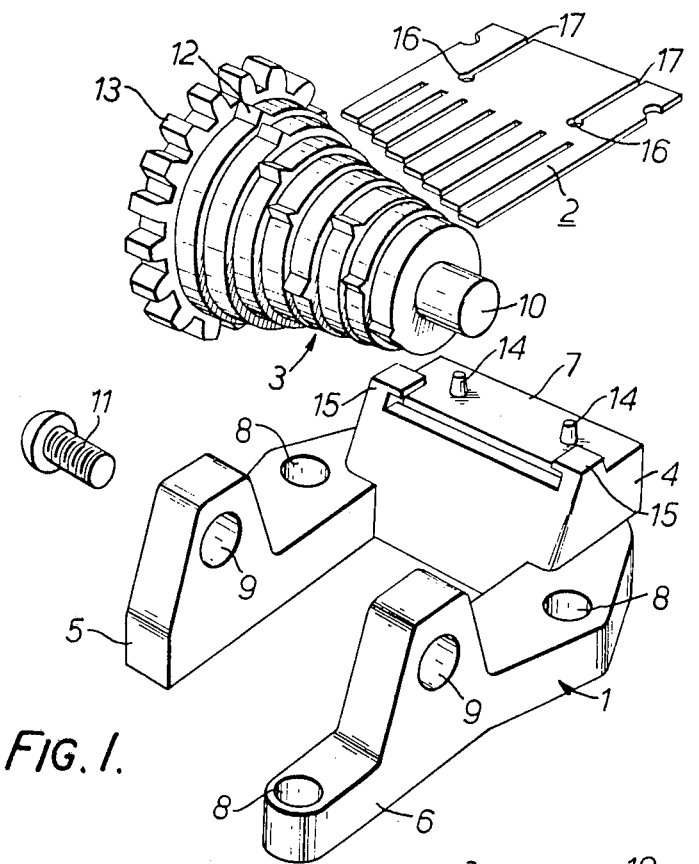

Referring to FIG. 1 o the drawings, the musical movement that is shown therein comprises a base 1, a "comb" 2 and a drum 3. The base 1 comprises a central section 4 and two arms 5 and 6. The central section 4 defines a platform 7 upon which upright pins 14 are integrally formed or otherwise mounted and two lipped pillars 15 that are arranged to co-operate with the comb 2 for fastening purposes as will be further described below. The arms 5 and 6 are provided with threaded holes 8 for securing the base 1 to a sound, box or the like. The arms 5 and 6 are also provided with two plain aligned holes 9 in which is rotatably supported the drum 3.

The drum 3 comprisees a stub shaft 10 formed at one end and a coaxial screw-threaded hole formed at the opposite end. The stub shaft 10 is inserted into one of the holes 9 and a bolt 11 is passed through the other hole 9 and into the screw-threaded hole at the corresponding end of the drum 3. The drum 3 is thus rotatably supported between the arms 5 and 6.

The drum 3 is not of right-circular cylindrical configuration as are the drums in conventional musical movements but has the shape of a frustum of a stepped cone. The outer curved surface of each step of the cone is, where required, provided with projections 12 which are preferably of triangular configuration in order to give the projections the required strength but this is by no means essential and projections of curved or other configurations could equally well be provided. It will be noted from FIGS. 1 and 2 of the drawings that each projection 12 does not extend radially further outwards from the intended axis of rotation of the drum than the height of the next step that is of greater diameter. A toothed pinion 13 is intergrally formed next to the drum step of greatest diameter, said pinion 13 being intended for cooperaion with a drive mechanism that may be of any suitable known or other construction that is not the subject of the present invention and which is accordingly not illustrated in the drawings.

Figure 2:
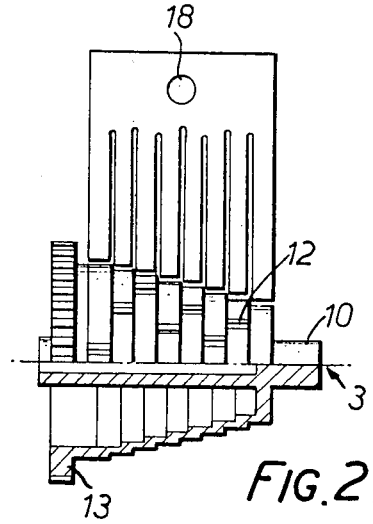

It will be realized from a study of FIGS. 1 and 2 of the drawings that the illustrated drum 3 may be formed by a simple injection moulding or die-casting operation because the stepped construction and the formation of the projections 12 does not impede release of the moulded or cast article which thus avoids employinv movable cores in the manufacture of the drums 3. There may, in fact, be circumstances in which it is desirable that some or all of the projections 12 should have a greater radial extent than that of the neighboring larger steps of the drum, for example when at least one comb prong or tooth needs to be particularly vigorously vibrated or "sounded". Under these circumstances, the drum 3 can be formed in segments of which there may conveniently, but not essentially, be three segments each subtending 120° at the intended axis of rotation of the drum. The shape of the drum segments is such as to allow each segment to be moulded by a simple injection moulding operation or to be die-cast in a die-split mould. The separately produced segments are subsequently secured to one another in any convenient known manner.

In accordance with a principal feature of the invention, the comb 2 is formed by chemically machining a sheet of phosphor bronze, pre-tempered spring or other steel, a beryllium-copper alloy or other suitably resilient metallic material. The outermost ends of the prongs or teeth of the comb 2 are not aligned, as is necessary for co-operation with the pins on conventional right-circular cylindrical drums, but ae so positioned that, when the comb 2 has been connected to the base 1, the ends of the prongs or teeth will co-operate with the projections 12 on the successive steps of the drum 3.

The chemical machining process comprises the stages of preparing photographic negatives of the desired shape of the comb 2, in duplicate, said negatives peferably forming parts of sheets that comprise a plurality of such comb negatives. A sheet of the metal that is to be employed is then covered on both sides by a resist and two negatives are placed over the opposite faces of the metal sheet taking care to ensure that said negatives are very accurately aligned. The resist, which is a known material, is then exposed to ultra-violet light to harden those parts thereof that are under transparent parts of the negatives. the negatives are then removed and the unexposed non-hardened portions of the resist are washed away. The metal sheet is then immersed in an acid which attacks the exposed metal chemically, quickly removing that metal and leaving only the required shape that is protected on both sides by the hardened and adhering resist. The hardened resist is subsequently removed in a known manner leaving only the comb or combs 2 of required shape. It has been found, unexpectedly, that combs 2 produced quickly and simply in the manner that has just been described are of such accurate shape that they do not need the subsequent tedious and expensive tuning operation that are almost always necessary when combs are made by stamping as discussed earlier. The avoidance of any machining operation has the result that there is no adverse effect upon the tone of the notes that each comb 2 can produce which is attributable to such machining.

Figure 3:
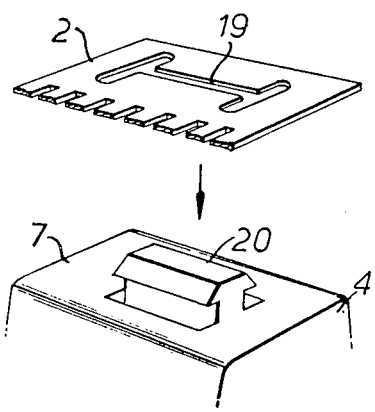

It will be seen from FIG. 1 of the drawings that, in accordance with a further feature of the invention, the comb 2 is formed with holes 16 that are intended to co-operate with the pins 14 for fastening purposes. The holes 16 are connected to an edge of the comb 2 that is remote from its prongs or teeth by narrow slots 17 and it will be apparent that, upon sliding the comb 2 to the right as seen in FIG. 1 of the drawings beneath the lips of the two pillars 15 with the edge of said comb that has just been mentioned foremost, a condition will soon be reached in which the resilient comb 2 will snap into a configuration in which the pins 14 are entered upwardly through the holes 16 whle opposite edge regions of the comb are effectively clamped by the lips of the pillars 15. The comb 2 can thus be securely and effectively fastened in position on the platform 7 without employing any fastening means such as screws, rivets or the like thus avoiding one step in the assembly of the musical movement. FIG. 2 of the drawings illustrates an alternative construction in which a single hole 18 is formed through the comb 2 for the reception of a screw or like fastener which can be employed to fasten the comb 2 in its appointed position in co-operation with a screw-threaded hole formed on top of the central section 4 of the base 1. FIG. 3 of the drawings illustrates a further alternative construction in which a slot 19 of broad H-shaped configuration is chemically machined into the comb 2 for co-operation with a barbed projection 20 integrally formed or otherwise mounted on the platform 7 of the central section 4, the platform 7 being, in this case, of plain flat configuration apart from the barbed projection 20. Clearly, other forms of quickly engageable fastening are possible as alternatives to those illustrated in FIGS. 1 to 3 of the drawings since any desired shape can be given to the fastening portion of the comb 2 by chemical machining without difficulty. The combs 2 may have more, or less, prongs or teeth than the combs that are illustrated in the drawings and, in the case of a very broad comb having a large number of prongs or teeth, additional fastening means, such as the holes 16 or 18 or the slot 19.

We claim:

1. A process for producing a metal comb for use in a musical movement, wherein the process comprises the steps of preparing duplicate photographic negatives of the desired shape of the comb, covering both sides of a sheet of the metal from which the comb is to be formed by a resist, positioning said photographic negatives in accurate alignment with one another and in masking relationship with the resistcovered opposite sides of said sheet, hardening those parts of the resist that are in register with substantially transparent regions of said negatives, removing the negatives, removing the unhardened parts of the resist, chemically etching the areas of the metal sheet that are not protected by the remaining hardened parts of the resist to form individual teeth of the comb which are tonally accurate and require no subsequent mechanical tuning operation, and removing the hardened resist from both sides of the metal comb.

2. A process according to claim 1, wherein the step of hardening those parts of the resist that are in register with substantially transparent regions of said negatives is effected by exposing them to a source of ultraviolet light.

3. A process according to claim 1, wherein the step of removing the unhardened parts of the resist is effected by washing.

4. A process according to claim 1, wherein the step of removing the parts of the metal sheet that are not protected by the remaining hardened parts of the resist is effected by immersion in an acid which will attack the exposed metal chemically.

5. A process according to claim 1, wherein said duplicate photographic negatives are prepared as parts of at least one sheet that comprises a plurality of such negatives.

* * * * *